United States Patent [19]
Schwenk

[11] Patent Number: 6,144,258
[45] Date of Patent: *Nov. 7, 2000

[54] APPARATUS AND METHOD FOR AMPLIFYING AN AUDIO SIGNAL WITHOUT REFERENCE TO GROUND

[76] Inventor: Tracy R. Schwenk, 180 NE. 12th Ave. Unit 11C, Hallandale, Fla. 33009

[*] Notice: This patent issued on a continued prosecution application filed under 37 CFR 1.53(d), and is subject to the twenty year patent term provisions of 35 U.S.C. 154(a)(2).

[21] Appl. No.: 09/049,751

[22] Filed: Mar. 27, 1998

[51] Int. Cl.$^7$ .......................................................... H03F 3/30
[52] U.S. Cl. .............................. 330/296; 330/69; 330/146
[58] Field of Search ................................ 330/69, 146, 296

[56] References Cited

U.S. PATENT DOCUMENTS

| | | |
|---|---|---|
| 2,629,014 | 2/1953 | Edwards . |
| 3,818,361 | 6/1974 | Gonda . |
| 3,859,604 | 1/1975 | Rankin . |
| 4,357,579 | 11/1982 | Kato et al. . |
| 4,586,003 | 4/1986 | Gorzel et al. . |
| 4,651,112 | 3/1987 | Keysor . |
| 4,668,921 | 5/1987 | Tamura . |
| 5,347,230 | 9/1994 | Noro . |
| 5,396,194 | 3/1995 | Williamson et al. . |
| 5,838,196 | 11/1998 | Yoshizawa ............................ 330/146 |

FOREIGN PATENT DOCUMENTS

| | | |
|---|---|---|
| 0443507 A2 | 2/1991 | European Pat. Off. . |
| 1452321 | 3/1979 | United Kingdom . |
| 2181916 | 4/1987 | United Kingdom . |

OTHER PUBLICATIONS

Jacob Millman, "Microelectronics: Digital and Analog Circuits and Systems," McGraw–Hill, Inc., N.Y., 1979, pp. 359 and 672.

*Primary Examiner*—Michael B Shingleton
*Attorney, Agent, or Firm*—Alston & Bird LLP

[57] ABSTRACT

There is provided an audio power amplifier having an output DC isolated from ground between two capacitors which are connected in series across a bias potential. The bias potential may be generated from common AC line currents by a simple bridge rectifier without the need for a bulky power supply transformer. The amplifier is DC isolated from the input signal, and hence from ground, by a balun or other small-signal transformer. Feedback is provided to compensate for ripple appearing on the bias potential.

17 Claims, 2 Drawing Sheets

APPARATUS AND METHOD FOR AMPLIFYING AN AUDIO SIGNAL WITHOUT REFERENCE TO GROUND

FIELD OF THE INVENTION

The invention relates to an apparatus and method for audio signal amplification.

BACKGROUND OF THE INVENTION

The use of semiconductor devices and integrated electronic circuitry has brought significant reductions in the size, weight and cost of audio amplifier circuitry as compared with discrete electronics approaches of a prior generation. In attempts to exploit the potential of semiconductor devices and integrated electronics, audio engineers have endeavored to develop amplifiers with increased audio output power in a smaller, lighter, more cost-effective package while maintaining high quality sound reproduction. As the size, weight and cost of integrated electronics have decreased, audio amplifier packaging form factors have come to be dominated by the size and weight of bulky power transformers and associated heat sinking conventionally used to provide the electronic circuitry with DC power from an alternating current (AC) power source. In conventional power supply designs for audio amplifiers, two DC bias levels and a ground reference are generated from the AC line power source commonly available from the wall sockets of buildings and homes. Transformer physical parameters have thus imposed a limitation on the extent to which audio power amplifiers may be miniaturized with conventional audio amplifier circuit topologies powered by conventional power supplies.

Audio engineers have employed a number of techniques in attempts to overcome or mitigate the size and weight constraints imposed by conventional power supply circuitry. In U.S. Pat. No. 4,484,150, an apparatus is described which uses pulsed power techniques to enable the use of a much smaller power transformer for a given audio power output and for a given alternating current power input frequency. Other approaches to minimize transformer size and weight have employed switching power supplies operating at very high switching frequencies (e.g., 20,000 Hz). As the operating frequency of such switching power supplies increases, the number of turns in the coils of the transformer can be reduced correspondingly for the same amount of transformer power output and transformer size may thus be decreased.

A further improvement in the design of switching power supplies for the reduction of power transformer size and weight is disclosed in U.S. Pat. No. 4,808,946, which discloses power pulse width modulation in a switching power supply in order to match the power delivered through the transformer to the instantaneous power needs of the audio amplifier circuit. In that approach, load current sense feedback is provided to the pulse width modulation circuitry to control the power pulses delivered through the transformer.

While the aforementioned design approaches can to some extent mitigate the size, weight and cost problems of conventional transformer-based audio amplifier power supplies, and while for certain applications and design objectives these approaches may be desirable, there are accompanying design problems which offset to some extent the advantages derived from the use of these approaches. For example, circuit complexity and costs may be increased substantially with such approaches relative to transformer-based designs. Circuit designs requiring two DC bias levels and a ground reference thus suffer from inherent limitations which impose constraints on the extent to which transformer size and weight, and hence circuit size, weight and cost, may be minimized.

SUMMARY OF THE INVENTION

It is with the foregoing considerations in mind that the apparatus and the method of the present invention were developed, with a primary object of the present invention being to provide an audio amplifier and method where the requirement for the power transformer has been eliminated entirely, and yet the amplifier nonetheless provides satisfactory audio performance.

In this regard, the apparatus and method of the present invention amplify a time-varying signal, and particularly amplify an audio signal, with power provided from an alternating current source, such as AC line current, without a heavy power transformer.

The power amplifier circuit of the present invention includes an amplifier which is adapted to drive an associated load having first and second load terminals in response to a time-varying input signal provided via first and second signal terminals. The amplifier has means for biasing the amplifier, such as positive and negative bias terminals for receiving amplifier bias current. The amplifier has means to DC isolate the load from the source of the bias current, such as a first capacitor connected between the second load terminal and the positive bias terminal and a second capacitor connected between the second load terminal and the negative bias terminal. The amplifier also has means to apply an AC coupled signal to the amplifier, such as a first amplifier input for connecting to the first signal terminal and a second amplifier input for connecting to the second signal terminal. The amplifier has an output to drive the first load terminal of an associated load, such as an audio speaker. Because the second load terminal of the associated load is connected to the connection point between the first and second capacitors, the load is DC isolated from the source of the bias current and the power amplifier circuit can amplify the time-varying signal without reference to ground.

The method of the present invention for amplifying a time-varying signal to drive an associated load includes the steps of charging the series combination of a first capacitor and a second capacitor with a voltage potential between a first bias level and a second bias level, connecting a second load terminal of the load to the connection between the first capacitor and the second capacitor such that the power amplifier circuit can amplify the time-varying signal without reference to ground, biasing an amplifier with the first bias level and the second bias level, applying an AC coupled input signal between a first amplifier input of the amplifier and a second amplifier input of the amplifier, and driving a first load terminal of the load with the amplifier.

In a typical application of the invention, an AC power source, such as a 60 Hz, 120 VAC line current, is rectified, such as by a diode bridge rectifier, to generate a bias voltage potential. The series connection of the first and second capacitors is connected across the bias voltage potential to create a voltage divider. The second load terminal is connected to the series connection point to DC isolate the load from the power source. The load is thus not referenced to ground and is not referenced to a third (e.g. a 0 Volt or other) leg from the power source.

Coupling means, such as capacitive feedback, is preferably provided from the second load terminal to the amplifier input to compensate for ripple in the bias voltage potential.

Preferably, isolation means, such as an audio frequency balun or other small isolation transformer, is provided to isolate the amplifier input from the signal, which is typically referenced to ground. The amplifier input may thus be advantageously isolated from ground.

The power amplifier circuit of the present invention, and the associated method for amplifying a time-varying signal, overcome the size, weight and cost deficiencies of conventional transformer-based audio amplifier power supplies by DC isolating the amplifier load, such as an audio speaker, from the DC power source. Because the load is not referenced to ground, the need for a power transformer is eliminated and the size, weight and cost of the circuit may be reduced accordingly.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

In general, the apparatus of the present invention comprises a power amplifier circuit 20 in which the load being driven by the circuit is DC isolated from the power source by two capacitors connected in series across a bias voltage potential, the load being connected to the point between the two capacitors. Because the load is DC isolated from the power source, only one voltage potential (one DC level with or without reference to ground) is required and the circuit may be powered from an AC line source by a simple, compact bridge rectifier, thus minimizing the overall size, weight and cost of the power amplifier. To compensate for ripple on the bias voltage potential, capacitively-coupled feedback from the load to the amplifier input is preferably employed. The amplifier input is also preferably DC isolated and ground isolated from the input signal, which is typically referenced to ground, by a balun or other small-signal isolation transformer.

Figure 1:
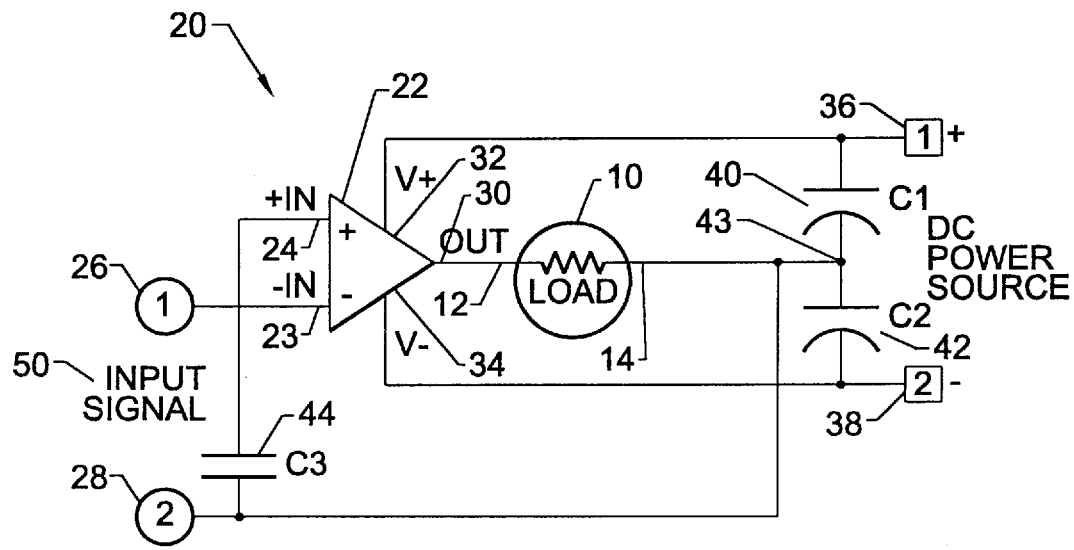
FIG. 1 is a schematic diagram depicting the amplifier of the present invention and the key circuit elements thereof.

One embodiment of the power amplifier circuit 20 of the present invention is depicted schematically in FIG. 1. Amplifier 22 comprises biasing means, such as a positive bias terminal 32 and a negative bias terminal 34 to which first bias level 36 and second bias level 38, respectively, are connected to provide bias current to amplifier 22. In addition to amplifier 22, the power amplifier circuit 20 includes first capacitor 40 and second capacitor 42 connected in series between first bias level 36 and second bias level 38, forming an AC voltage divider and being charged by the voltage potential between first bias level 36 and second bias level 38. Amplifier 22 further comprises an output 30 which drives an associated load 10 at first load terminal 12. DC isolation means, to isolate amplifier 22 from the power source, is preferably provided by the connection of second load terminal 14 to series connection point 43. Amplifier 22 further comprises means to apply an AC coupled time-varying input signal, such as first amplifier input 23 and second amplifier input 24 which are coupled to input signal 50 by way of first signal terminal 26 and second signal terminal 28, respectively. Such coupling means preferably includes means to isolate the time-varying input signal from first amplifier input 23 and second amplifier input 24. To compensate for ripple noise on the bias voltage potential between first bias level 36 and second bias level 38, the power amplifier circuit 20 includes coupling means, such as third capacitor 44 or other capacitive coupling means, which couples any ripple noise from series connection point 43 back to second amplifier input 24. Load 10 is driven by the AC difference between output 30 and series connection point 43.

Because the power amplifier circuit is DC isolated from the power source, only one voltage potential (the voltage potential between first bias level 36 and second bias level 38) is required. Power amplifier circuit 20 may therefore be powered from an AC line source by a simple, compact bridge rectifier, without the need for a power transformer, thus minimizing the overall size, weight and cost of power amplifier circuit 20.

Figure 2:
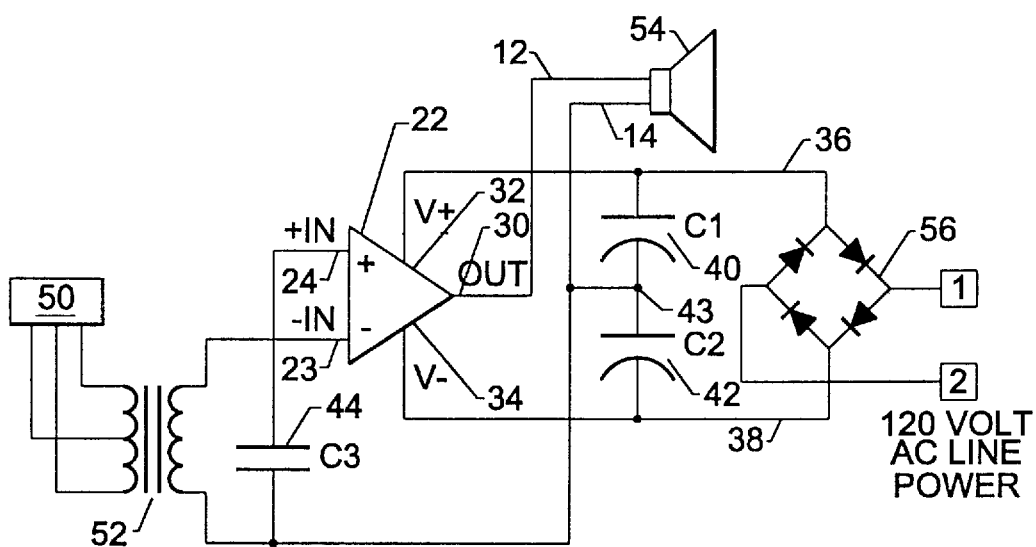
FIG. 2 is a schematic diagram illustrating an application of the amplifier of the present invention in an audio power amplifier powered by common alternating line current.

A typical audio frequency application of the invention is depicted schematically in FIG. 2. Audio speaker 54, replacing generalized load 10 from FIG. 1, is driven by output 30 of amplifier 22 to series connection point 43. As shown, the power amplifier circuit 20 includes rectifier 56, which is preferably a bridge rectifier, which rectifies current from AC line source 58, which is typically a 120 VAC, 60 Hz or similar common household line source. First bias level 36 and second bias level 38 are developed by rectifier 56 and typically include substantial ripple. For a 60 Hz, 120 VAC line current, the ripple on first bias level 36 and second bias level 38 can be [2 V RMS], for example. To DC isolate first amplifier input 23 and second amplifier input 24 from input signal 50, which is typically referenced to ground, the power amplifier circuit 20 preferably includes input isolation means such as balun 52 or other suitable audio frequency transformer. To prevent high frequency oscillation of amplifier 22 and resulting transistor damage in the absence of any reference to ground, some trim capacitance, such as 0.002 microFarads, is preferably included between the base and the emitter of the first transistor stage of amplifier 22.

Figure 3:
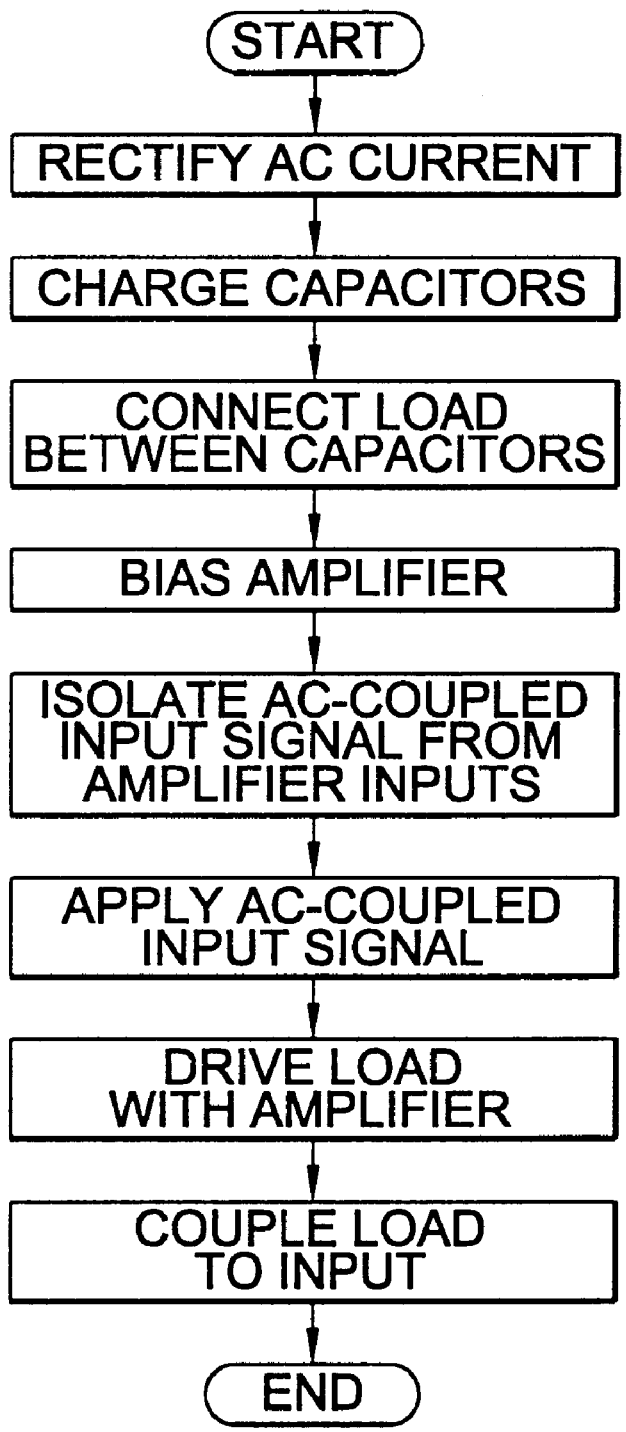
FIG. 3 is a flow diagram illustrating the steps in the method according to one embodiment of the present invention.

In operation, power amplifier circuit 20 may be mounted in or on the enclosure for speaker 54. Power amplifier circuit 20 typically includes an AC power plug which is plugged into a wall socket providing AC line source 58, and bridge rectifier 56 develops substantially constant first bias level 36 and second bias level 38, charging first capacitor 40 and second capacitor 42 and providing bias current to amplifier 22 as shown in FIG. 3. First capacitor 40 and second capacitor 42 are each preferably fairly large capacitors, such as at least 1000 microFarad capacitors, and may each comprise the parallel connection of two or more capacitors. Audio-frequency input signal 50 is DC isolated and ground isolated from amplifier 22 via balun 52 and excites the differential input to amplifier 22 defined by first amplifier input 23 and second amplifier input 24. Amplifier 22, in response to input signal 50, drives speaker 54 to DC-isolated series connection point 43 between charged first capacitor 40 and charged second capacitor 42. Ripple present at series connection point 43 from ripple developed by rectifier 56 on the voltage potential across first bias level 36 and second bias level 38 is compensated for to some extent by feedback through third capacitor 44 connected between series connection point 43 and second amplifier input 24.

The power amplifier circuit 20 and associated method for amplifying a time-varying signal overcome the size, weight and cost deficiencies of conventional transformer-based audio amplifier power supplies by DC isolating the amplifier load, such as an audio speaker, from the DC power source. Because the load is not referenced to ground, the need for a power transformer is eliminated and the size, weight and cost of the circuit may be reduced accordingly.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A power amplifier circuit for amplifying a time-varying signal provided via first and second signal terminals, the power amplifier circuit comprising:
   an amplifier, adapted to drive an associated load having first and second load terminals, the amplifier having:
      a first amplifier input for coupling to the first signal terminal,
      a second amplifier input for coupling to the second signal terminal,
      an output for connection to the first load terminal,
      a positive bias terminal for connection to a first bias level, and
      a negative bias terminal for connection to a second bias level;
   a first capacitor connected between the second load terminal and the first bias level; and
   a second capacitor connected between the second load terminal and the second bias level,
   wherein the connection of said first and second capacitors to the second load terminal is independent of ground, and wherein said amplifier drives the associated load, based on the voltage difference between said output of said amplifier and the connection of said first and second capacitors to the second load terminal such that the power amplifier circuit amplifies the time-varying signal without reference to ground.

2. A power amplifier circuit according to claim 1 further comprising a rectifier to generate the first bias level and the second bias level from an alternating current source.

3. A power amplifier circuit according to claim 1 wherein the second load terminal and the second amplifier input are connected by a third capacitor.

4. A power amplifier circuit according to claim 1 wherein the second load terminal is operatively coupled to the second amplifier input.

5. A power amplifier circuit according to claim 1 wherein the load is an audio speaker.

6. A power amplifier circuit according to claim 1 further comprising means for input isolating connected between the time-varying signal and the first and second amplifier inputs.

7. A method for amplifying a time-varying signal to drive an associated load, the method comprising:
   providing a series combination of a first and a second capacitor, wherein a connection between the first and second capacitors is independent of ground;
   charging the series combination of a first capacitor and a second capacitor with a voltage potential between a first bias level and a second bias level;
   connecting a second load terminal of the load to the connection between the first capacitor and the second capacitor, such that the second load terminal of the load is independent of ground;
   biasing an amplifier with the first bias level and the second bias level;
   applying an AC coupled input signal between a first amplifier input of the amplifier and a second amplifier input of the amplifier; and
   driving a first load terminal of the load with the amplifier, wherein said driving step drives the associated load, based on the voltage difference between the output of the amplifier and the connection of the first and second capacitors to the second load terminal such that the power amplifier circuit amplifies the time-varying signal without reference to ground.

8. A method for amplifying a time-varying signal according to claim 7 further comprising rectifying an alternating current to generate the first bias level and the second bias level.

9. A method for amplifying a time-varying signal according to claim 7 further comprising connecting a third capacitor between the second load terminal and the second amplifier input.

10. A method for amplifying a time-varying signal according to claim 7 further comprising operatively coupling the second load terminal to the second amplifier input.

11. A method for amplifying a time-varying signal according to claim 7 wherein the load is an audio speaker.

12. A method for amplifying a time-varying signal according to claim 7 further comprising connecting means for input isolating between the time-varying signal and the first and second amplifier inputs.

13. A power amplifier circuit for amplifying a time-varying signal provided via first and second signal terminals, the power amplifier circuit comprising:
   an amplifier having an input and an output and adapted to drive an associated load with the output;
   means for biasing the amplifier;
   means for applying an AC coupled signal to the input; and
   means for DC isolating the load from a power source, wherein said means for DC isolating includes a series combination of a first capacitor and a second capacitor, wherein the load is connected between the output of the amplifier and the connection between the first and second capacitors, wherein the connection between the first and second capacitors and the load is independent of ground, and
   wherein said amplifier drives the associated load, based on the voltage difference between the output of said amplifier and the connection of the first and second capacitors to the load, such that the amplifier amplifies the time-varying signal without reference to ground.

14. A power amplifier circuit according to claim 13 wherein the biasing means comprises a rectifier to generate a plurality of DC bias levels from an alternating current source.

15. A power amplifier circuit according to claim 13 further comprising means for capacitively coupling the load to the input.

16. A power amplifier circuit according to claim 13 further comprising means for coupling the load to the input.

17. A power amplifier circuit according to claim 13 further comprising means for input isolating the time-varying signal from the first and second amplifier inputs.

* * * * *